United States Patent [19]

Tuttle

[11] Patent Number: 5,558,679
[45] Date of Patent: Sep. 24, 1996

[54] METHOD FOR MOUNTING A BATTERY ON A SUBSTRATE

[75] Inventor: Mark E. Tuttle, Boise, Id.

[73] Assignee: Micron Communications, Inc., Boise, Id.

[21] Appl. No.: 517,504

[22] Filed: Aug. 21, 1995

[51] Int. Cl.⁶ .................................................. H01M 06/00
[52] U.S. Cl. ........................................ 29/623.1; 29/623.5
[58] Field of Search ................................. 29/623.1, 623.4, 29/623.5; 429/162

[56] References Cited

U.S. PATENT DOCUMENTS

| | | | |
|---|---|---|---|
| 4,615,959 | 10/1986 | Hayashi et al. | 429/194 |
| 4,732,825 | 3/1988 | Kamata et al. | 429/162 |
| 5,326,652 | 7/1994 | Lake | 429/127 |
| 5,350,645 | 9/1994 | Lake et al. | 429/124 |

*Primary Examiner*—Anthony Skapars
*Attorney, Agent, or Firm*—Stephen A. Gratton

[57] ABSTRACT

An improved battery, an improved battery contact assembly and an improved method for attaching a battery to a substrate are provided. The battery includes a housing and a cover for attachment to the housing by crimping. During the crimping process a portion of the housing is bent over a portion of the cover such that a portion of the housing is substantially co-planar with a portion of the cover. Thus the two co-planar surfaces provide the positive and negative contact surfaces of the battery on a single side of the battery. The receiving portion of the contact assembly includes a substrate having a pair of contacts formed thereon. The contacts are shaped and sized to match the contact surfaces of the battery. The battery is attached to the substrate and traces using an electrically conducting adhesive.

17 Claims, 3 Drawing Sheets

METHOD FOR MOUNTING A BATTERY ON A SUBSTRATE

FIELD OF THE INVENTION

The present invention relates to an improved battery, an improved battery contact assembly and to an improved method for mounting a battery. More specifically, the present invention relates to a holderless battery contact assembly where the battery and the substrate have a single plane of contact.

BACKGROUND OF THE INVENTION

Micro-electronic components, i.e., integrated circuits, are presently used as component parts in a wide variety of electronic devices, for example, calculators, watches, organizers, cordless telephones, radios and tape recorders. The portability of such devices has created the need for miniature power cells which must produce increased energy per unit volume and superior discharge characteristics over conventional batteries. This need has lead to the development of relatively small, thin batteries which are constructed with an alkali metal anode, a non-aqueous electrolyte and cathodes which are constructed of non-stoichiometric compounds. Lithium is an especially suitable material for construction of the anode due to its relatively low molecular weight and high electrode negativity. Such small, thin solid state batteries can be made with a high energy density, a long shelf life, and are able to operate efficiently over a wide temperature range.

These thin, batteries are conventionally constructed in the form of a container referred to as a coin cell. The container includes a cylindrical housing (or can) and a lid (or anode cap) which are typically formed of nickel clad stainless steel. Typically such a battery is assembled by assembling the anode, separator, electrolyte and cathode components of the battery with the lid and then crimping the lid and housing together with a gasket therebetween. As thus assembled, the housing is in electrical contact with the cathode of the battery and the lid with the anode.

In the past these coin cell batteries were typically manufactured such that the lid provided the negative contact surface, while the housing on the opposite side of the battery provided the positive contact surface. By separating the positive and the negative contact surfaces of the coin cell battery, the likelihood of shorting the battery was thought to be minimized.

Because the battery contact surfaces were on opposite sides of the battery, the contacts of the device into which the battery was installed needed to contact the appropriate contact surfaces of the battery. Because each of the device contacts needed to physically contact an opposite side of the battery, the device contacts have also been used to assist in preventing movement of the battery with respect to the device.

The necessity of a device contact on each side of the battery required a physical structure on both sides of the battery when installed. Normally a deformable contact was provided on either side of the battery. The battery was then inserted between the device contacts and the pressure and the friction exerted by the device contacts retained the battery in place. Another method of retaining the battery within the device was to provide a recess in the device with a contact surface at the bottom of the recess. The battery was then installed into the recess. The second contact surface was provided on a device cover mating with the recess. Once the device cover was installed, it was in electrical contact with the remainder of the device and could act to transfer the current.

One of the problems associated with structures like those described above, which were designed to receive a battery having its contact surfaces on either end, is that the minimum thickness necessary to receive the battery was the sum of the battery thickness and the two contact assemblies at either end. As is apparent this does not provide a compact assembly.

There is, then, a need in the art for a battery and a battery contact assembly that minimizes the thickness required to receive the battery and which minimizes the complexity and time required for assembly. Accordingly, it is an object of the present invention to provide a battery and a battery contact assembly that are inexpensive and easy to manufacture, yet offering a high degree of reliability to minimize the possibility of electrical shorting across the terminals of the battery. It is another object of the invention to provide a battery having the contact surfaces of both terminals arranged to be substantially co-planar. It is yet another object of the invention to provide a support substrate for a battery having the contact surfaces of both terminals insulated from one another but contained in substantially a single plane. It is a still further object of the invention to provide a battery contact assembly wherein an electrically conducting adhesive is used to adhere the battery to a substrate and to establish an electrical connection to contacts on the substrate.

Other objects, advantages and capabilities of the present invention will become more apparent as the description proceeds.

SUMMARY OF THE INVENTION

In accordance with the present invention, an improved battery and an improved battery contact assembly are provided. The battery includes: a housing having a planar contact surface; a cathode adjacent to the housing; a cover having a planar contact surface; an anode adjacent to the cover; a separator between the anode and cathode; and a non-conductive gasket crimped between the housing and cover to seal the battery and prevent electrical shorting between the contact surfaces. The housing and cover are crimped together such that the contact surfaces on the housing and cover are substantially co-planar to one another. With this arrangement the positive and negative terminals of the battery are on a same side of the battery and are substantially co-planar to one another. This permits the battery to be attached to a substrate with a single layer of conductive adhesive.

A contact assembly for mounting the battery includes: a substrate having a battery receiving portion; a positive contact formed on the substrate; a negative contact formed on the substrate; and an insulating member for insulating the contacts from one another. In an illustrative embodiment the insulating member comprises an insulator patch placed over a portion of one of the contacts or applied directly to the battery. In an alternate embodiment the substrate is formed as an interlevel substrate, and the insulating member comprises an interlevel connector formed within the substrate in electrical communication with one of the contacts.

For attaching the battery to the substrate, a layer of an adhesive, such as a z-axis anisotropic adhesive, is formed on the substrate over the contacts. The battery is positioned such that the negative contact surface of the battery is adjacent to the negative contact on the substrate but insulated from the positive contact on the substrate by the insulator patch or interlevel connection. Additionally, the battery is positioned such that the positive contact surface of the battery is adjacent to the positive contact on the substrate. The z-axis anisotropic adhesive secures the battery to the substrate and establishes electrical communication between the negative and positive contact surfaces on the battery and the negative and positive contacts on the substrate.

In an illustrative embodiment a method for mounting a battery on a substrate, generally stated, includes the steps of: providing the substrate; forming positive and negative contacts on the substrate; insulating a portion of one of the contacts; providing a battery having a planar contact surface for the positive terminal and a planar contact surface for the negative terminal which are substantially co-planar to one another; and applying a conductive adhesive to the substrate for attaching the battery to the substrate and establishing an electrical connection between the contact surfaces on the battery and the contacts on the substrate.

The method of the invention can be practiced as well using a conventional battery in which the contact surfaces on the battery are not substantially co-planar. In this case separate beads of an adhesive, such as a metal filled epoxy, can be used to secure the battery to the substrate and to establish an electrical connection between the positive and negative contact surfaces on the battery and the positive and negative contacts on the substrate.

DETAILED DESCRIPTION OF THE INVENTION

Figure 1:
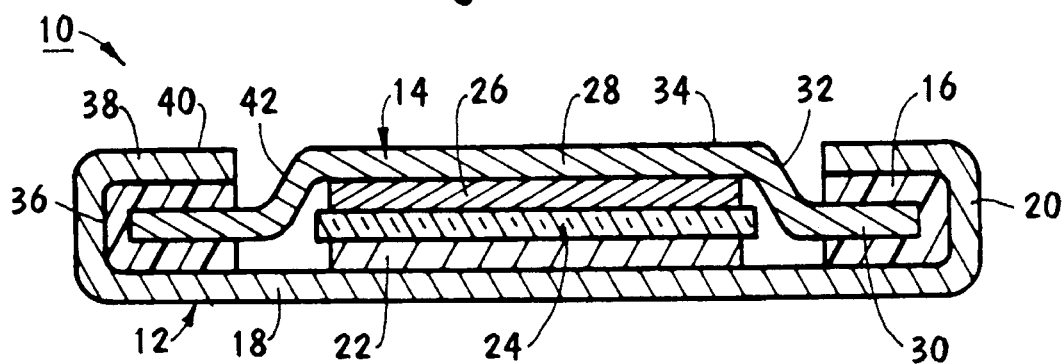
FIG. 1 is a cross-sectional view of the preferred battery.

Referring to FIG. 1, a coin or button cell battery 10 constructed in accordance with a preferred embodiment of the invention is illustrated. The battery 10 includes a container comprising a housing 12 and a cover 14 (or lid). Both the housing 12 and the cover 14 are formed of a metallic or other electrically conducting material. Preferably, the housing 12 and the cover 14 are made of nickel clad stainless steel. A gasket 16 is placed between the housing 12 and the cover 14. These components are secured to one another by crimping the components together.

In the illustrated embodiment, the battery 10 has a generally circular peripheral configuration and has a thickness that is much less than the diameter thereof. However, it will be evident to one skilled in the art that other peripheral configurations, such as; triangular, rectangular or hexagonal, can be employed in lieu of a generally circular configuration. Furthermore, although illustrated as a relatively thin structure, the battery 10 of the present invention can be formed in a cylindrical shape with a thickness greater than the diameter thereof.

The housing 12 can be described as a can or case adapted for mounting the components of a battery. The housing 12 can be formed by bending, stamping or shaping a single piece of metal. The housing 12 includes a generally circular shaped bottom portion 18 and an integrally formed annular sidewall portion 20. The housing 12 is sized to have anode, separator, cathode and electrolyte components of a battery placed therein.

The bottom portion 18 of the housing 12 includes an inside surface onto which the cathode 22 of the battery 10 is mounted. A separator 24 is adjacent to the cathode 22. Adjacent to the separator 24 is an anode 26.. The permissible and interchangeable elemental components of the anode 26, the separator 24 and the cathode 22 necessary to provide a high-quality battery are well known in the art. Preferably the anode 26 is made of lithium, separator 24 is made of microporous polypropylene, and cathode 22 is made of manganese dioxide with carbon and PTFE (polytetrafluoroethylene).

The cover 14 is connected to the anode 26. The cover 14 includes a center portion 28 and an outer annular portion 30 connected by a shoulder portion 32. The outer surface of the cover 14 provides a negative contact surface 34 for the battery 10 (i.e., negative terminal). The cover 14 has a generally circular peripheral configuration that approximates the circular peripheral configuration of the housing 12. The cover 20 can be formed of any suitable material, for example, nickel clad stainless steel, and can be formed by any suitable process, such as, stamping, bending, shaping or spinning and forming a flat piece of material.

During the crimping process, the annular sidewall 20 is folded over upon itself to form a top portion 38 and a recess 36. The recess 36 is defined by the bottom portion 18 of housing 12, the annular sidewall 20, and the folded over top portion 38. The crimping process is carefully controlled such that the outer surface of the top portion 38 provides a positive contact surface 40, which is in substantially the same plane as the negative contact surface 34 of cover 14.

The cover 14 is prevented from contacting the housing 12 by a gasket 16. The gasket 16 can be made of a number of materials which are well known in the art. Preferably, the gasket 16 is made of polypropylene.

Figure 2:
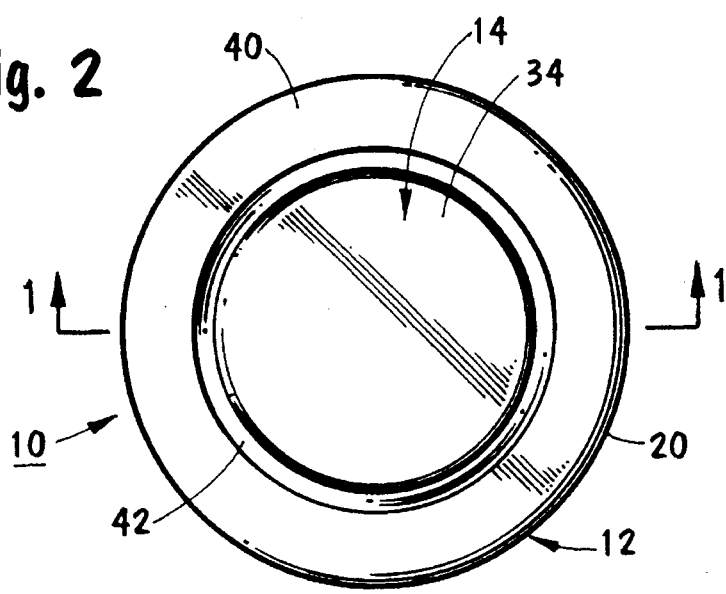
FIG. 2 is a top view of the preferred battery.

Referring now to FIG. 2, the top surface of battery 10 is shown. As can be seen, the negative contact surface 34 is a generally circular surface surrounded by the positive contact surface 40. The positive contact surface 40 is an annular surface generally concentric with the negative contact surface 34. The negative contact surface 34 and positive contact surface 40 are separated by a groove 42. The groove 42 is at least partially filled by the gasket 16.

Figure 3:
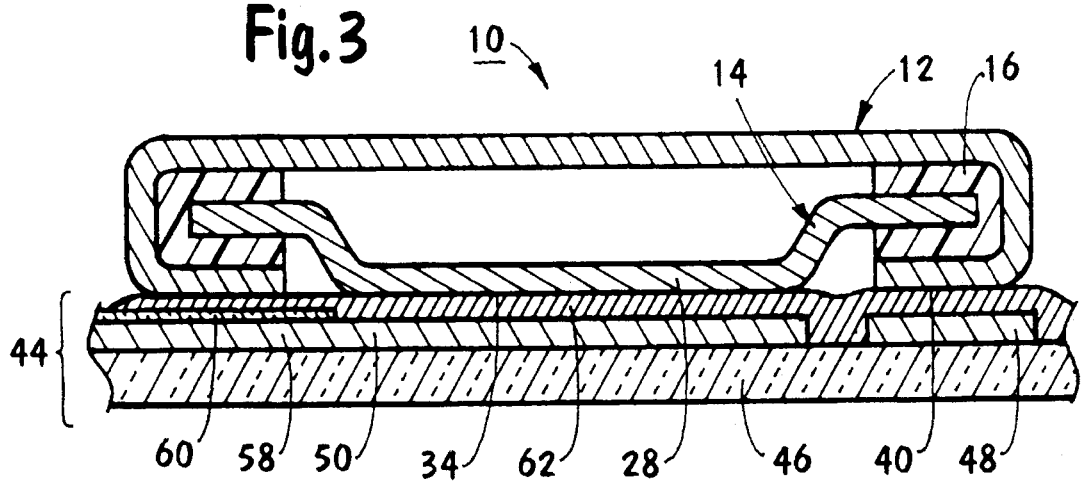
FIG. 3 is a cross-sectional view of a battery with parts removed and showing the battery mounted to a support substrate with the substrate cross sectioned along section line 3—3 of FIG. 4.

Referring now to FIG. 3, the battery 10 is shown installed on a receiving portion 44 of the contact assembly of the present invention. In FIG. 3, for simplicity, some components of the battery 10 are not shown. The receiving portion 44 of the assembly includes a substrate 46 formed of an insulating material. The substrate 46 can be formed of a suitable insulating material, such as those materials used for the manufacture of circuit boards and the like. By way of example the substrate can be formed of a glass filled polymeric material, a ceramic or a moldable thermoplastic.

Formed on the substrate 46 are a first contact in the form of a positive contact trace 48 and a second contact in the form of a negative contact trace 50. The positive and negative contact traces 48 and 50 can be formed by screen printing the traces on the substrate 46. Alternately the contact traces 48 and 50 can be formed by blanket deposition of a conductive material followed by photopatterning and etching. Other methods of forming the contact traces 48 and 50 on the substrate 46 are equally acceptable without departing from the scope and spirit of the present invention. Both the contact traces 48 and 50 are preferably formed of a highly conductive metal such as copper.

Figure 4:
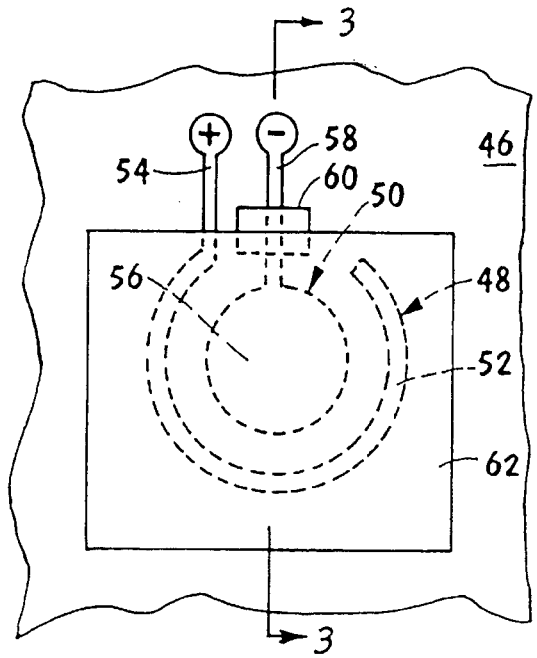
FIG. 4 is a plan view of a support substrate for mounting a battery in accordance with the invention.

The preferred configurations for the positive contact trace 48 and the negative contact trace 50 are best seen in FIG. 4. FIG. 4 shows a top view of a portion of the substrate 46 onto which the positive contact trace 48 and the negative contact trace 50 are mounted. As can be seen in FIG. 4, the positive contact trace 48 includes an arc portion 52 and a positive lead portion 54 extending therefrom. As can also be seen in FIG. 4, the negative contact trace 50 includes a circular portion 56 and a negative lead portion 58. The particular shapes, namely the circular portion 56 and arc portion 52, are merely exemplary and can easily be varied by those skilled in the art without departing from the spirit and scope of the present invention. As those in the art will appreciate, the shapes need only to be sized to provide a sufficient surface contact area for contact with the contact surfaces 34 and 40 of the battery 10 when it is installed.

Returning to FIG. 3, as can be seen, in order to prevent contact between the positive contact surface 40 of the battery 10 and the negative lead portion 58 of the contact trace 50, a non-conducting insulator patch 60 is mounted on the substrate 46 such that it covers the portion of the negative lead 58 that is most likely to come into contact with the positive contact surface 40 on the battery 10.

The insulator patch 60 can be made of any suitable electrically insulating material, including acrylics. The insulator patch 60 is preferably made of DuPont 5018 UV curable dielectric thick film ink. Preferably, the insulator patch 60 is formed on the receiving portion 44 of the substrate 46 by screen printing and application methods known in the art. As is apparent the insulator patch 60 need not be formed on the substrate 46 but could alternately be formed on the battery 10.

For purposes of providing a mechanical connection between the battery and substrate 46 and an electrical connection between the contact surfaces 34 and 40 of the battery 10 and the contact traces 50 and 48 on the substrate, a conductive adhesive 62 is used. The conductive adhesive 62 is preferably an anisotropic adhesive formed such that electrical resistance in one direction through the material will differ from that measured in another direction. Typically, high resistance is provided in at least one orthogonal direction (e.g., xy direction), while low resistance is provided in the remaining orthogonal direction (e.g., z direction). The conductivity in one direction is typically pressure sensitive, requiring that the material be compressed in that direction during bonding. One type of conducting anisotropic adhesive is known as "z-axis" anisotropic adhesive. Z-axis anisotropic adhesives are filled with conductive particles to a low level such that the particles do not contact each other in the xy plane. Compression of the material in the z direction establishes an electrical path. Z-axis anisotropic adhesives are formed as a viscous paste or as a film that is applied and then cured to harden. Both types of z-axis anisotropic adhesives (film or paste) come in a thermal plastic or thermal setting variety. Thermal plastic anisotropic adhesives are heated to soften for use and then cooled for curing. Thermal setting anisotropic adhesives require heat curing. Using an anisotropic adhesive, the battery can be adhered to the substrate, and multiple connections can be made with distinct contact traces on the substrate with a single section of adhesive. As those in the art will appreciate, alternate adhesives, all of which provide conductivity without shorting between distinct traces, could be used without departing from the scope and spirit of the present invention.

As is shown in FIG. 3, the battery 10 is positioned on receiving portion 44 of the substrate 46 such that negative contact surface 34 is immediately adjacent the circular portion 56 of negative contact trace 50. Likewise, positive contact surface 40 is immediately adjacent arc portion 52 of positive contact trace 48.

As those skilled in the art will appreciate, the present embodiment includes a circular center portion 28 on cover 14 and a circular portion 56 on negative contact trace 50 which generally corresponds in shape and dimensions to center portion 56. Additionally, arc portion 52 of positive contact trace 48 generally corresponds in shape and dimensions to the positive contact surface 40 of housing 12. Those skilled in the art will appreciate that where the contact surface configurations are varied on battery 10, the shapes of the positive and negative contact traces on substrate 46 may need to be varied to ensure sufficient electrical conductivity without risking shorting of the battery.

Additionally, as those in the art will appreciate, for particular shape configurations, it may be necessary to include additional insulating patches. The present invention contemplates use of insulating patches, where necessary, and the actual number of patches required is dependent on the particular configurations of the battery contact surfaces and the trace configurations on substrate 46.

Furthermore, while the foregoing embodiment has been described utilizing "positive" and "negative" descriptors for various components, those skilled in the art can appreciate that the polarity of the battery contact assembly could easily be reversed without departing from the scope of the present invention. To accomplish this, anode 26 and cathode 22 would need to be reversed within battery 10. With that change, the polarity descriptors of all the polarized components would thereby be reversed. A reversed polarity assembly is within the scope of the present invention.

Figure 4A:
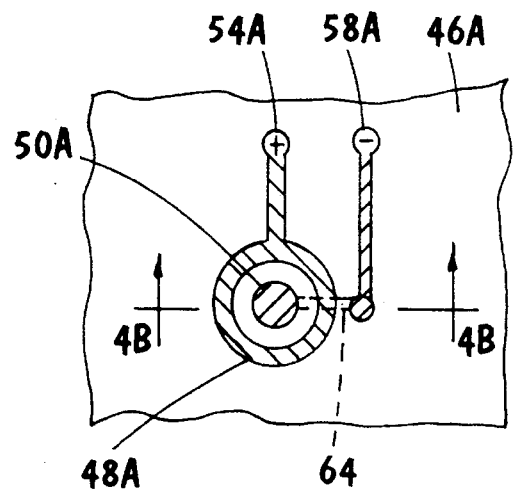
FIG. 4A is a plan view equivalent to FIG. 4 but showing an alternate embodiment support substrate.
Figure 4B:
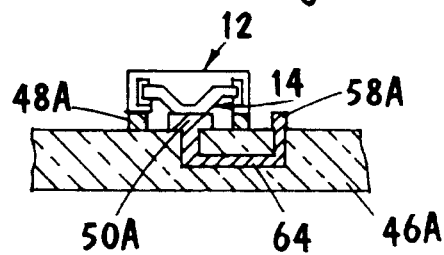
FIG. 4B is a cross sectional view of a battery with parts removed and showing the battery mounted to the alternate embodiment support substrate shown in FIG. 4A.

In addition, as would be apparent to those skilled in the art, multi-level connections could be used in place of the planar contact traces 48 and 50 (FIG. 4) to eliminate the need for the insulator patch 60 (FIG. 4). By way of example, and as shown in FIGS. 4A and 4B, a multi level substrate 46A is similar in construction to a multi level printed circuit board. A positive contact trace 48A and positive lead portion 54A are formed on a surface of the substrate 46A for establishing an electrical connection with the battery housing 12 (FIG. 4B). A negative contact trace 50A is formed on a surface of the substrate 46A for establishing an electrical connection with the cover 14 (FIG. 4B) of the battery. The negative contact trace 50A is electrically connected to an interlevel connector 64 (FIG. 4B). The interlevel connector 64 is formed within the substrate 46A in electrical communication with the contact trace 50A on the surface of the substrate 46A and a negative lead portion 58A in a different area on the surface of the substrate 46A. The negative contact trace 50A and negative lead portion 58A are thus insulated from the positive contact trace 48A and positive lead portion 54A by the insulative structure of the substrate 46A. The interlevel connector 64 can be formed of a conductive material such as metal embedded in the substrate 46A. Techniques that are known in the art such as lamination, injection molding, or via formation can be used to form the interlevel connector 64.

Figure 5:
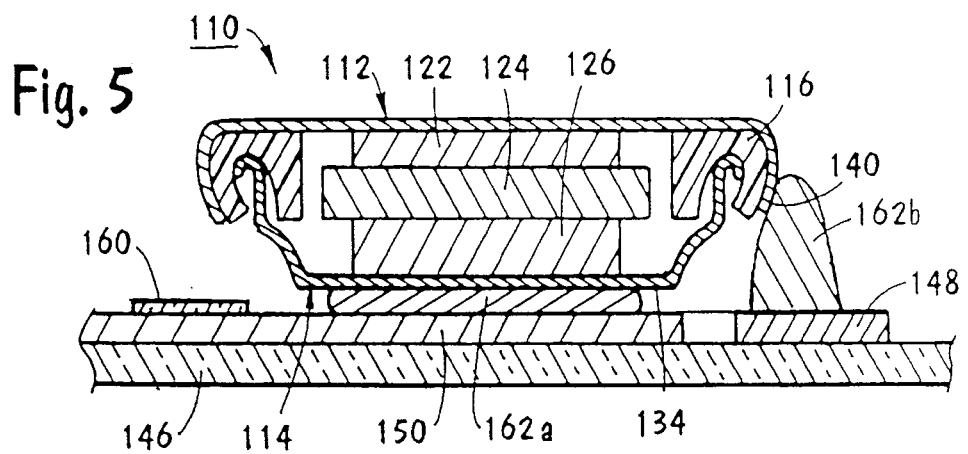
FIG. 5 is a cross-sectional view of a conventional coin cell battery mounted to a substrate in accordance with the invention.

Another alternate embodiment for the battery contact assembly is shown in FIG. 5. Battery 110 is a more conventional coin cell battery having a housing 112 and a cover 114 which are separated by a gasket 116 and are crimped together to leave an internal space. Inside this space, an anode 126 is adjacent to cover 114. Separator 124 is adjacent to anode 126 and cathode 122 is adjacent to separator 124 and housing 112. In this particular embodiment, a positive contact surface 140 of the battery 110 is not substantially co-planar with a negative contact surface 134 as was the case for battery 10 in FIGS. 1–3.

For the particular configuration shown in FIG. 5, an insulator patch 160 is mounted on a negative contact trace 150 which is mounted on a substrate 146. Additionally, a positive contact trace 148 is mounted on the substrate 146. From a top view (not shown), the positive contact trace 148 and negative contact trace 150 would have shape configurations generally similar to that shown in FIG. 4, assuming battery 110 is a generally cylindrical battery. Because positive contact surface 140 is not co-planar with negative contact trace 150, differing beads of adhesives, namely adhesive 162a, would be used between the negative contact surface 134 and the negative contact trace 150. On the other hand, adhesive 162b would be used between positive contact surface 140 and positive contact trace 148. To the extent that adhesive 162a is distinct from adhesive 162b, an anisotropic adhesive, such as z-axis adhesive, is not required. Simply a conducting adhesive, e.g., silver-filled epoxy, could be used. As those skilled in the art will appreciate, other conducting adhesives could be utilized without departing from the scope and spirit of the present invention.

DETAILED DESCRIPTION OF PREFERRED METHOD OF MANUFACTURE

Figure 6:
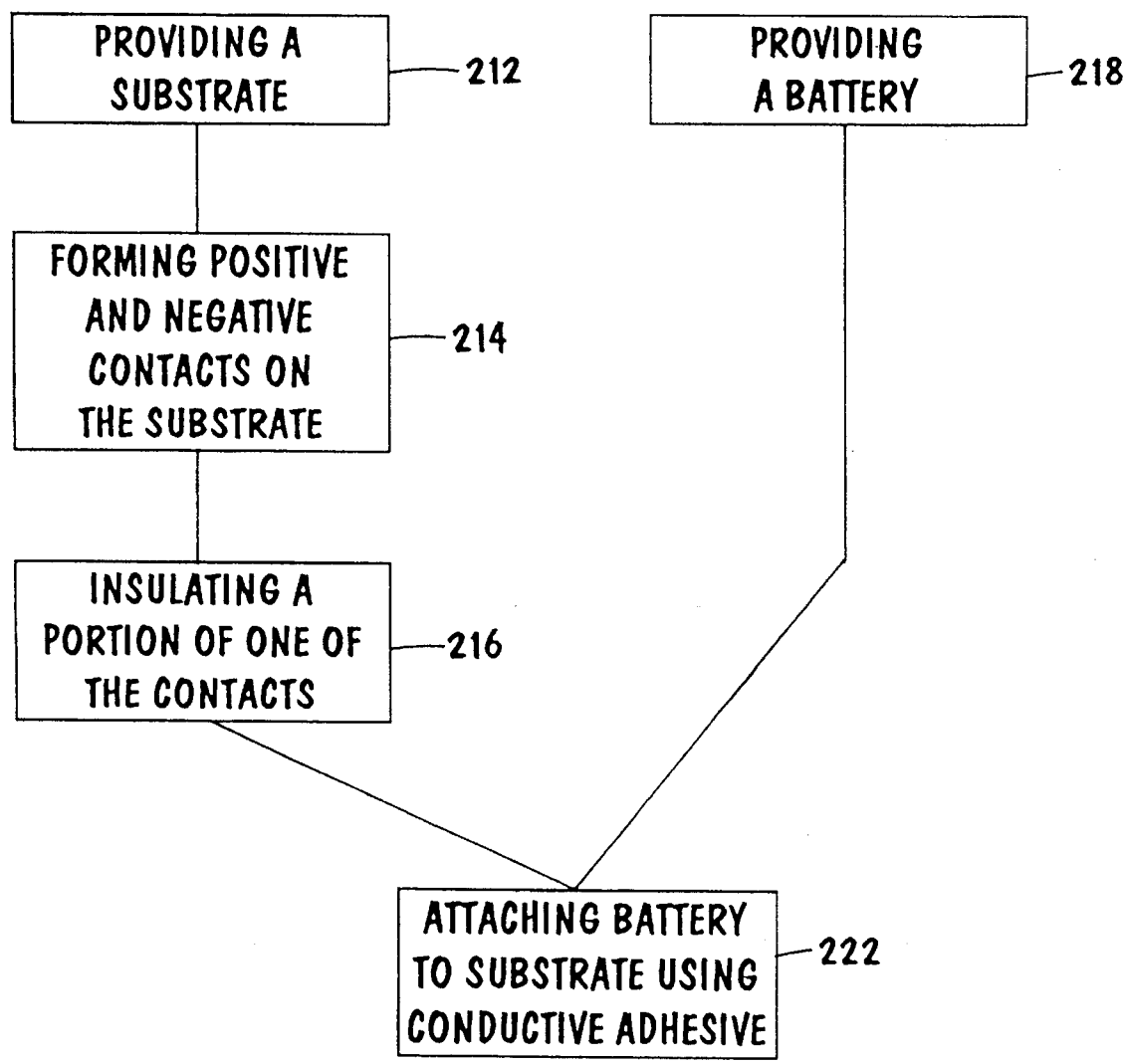
FIG. 6 is a flow chart of the principle steps of the method of the present invention.

A flowchart for the preferred method of applying a battery to a substrate is, generally stated, shown in FIG. 6. This method includes the steps of: providing a substrate, step 212; forming positive and negative contacts on the substrate, step 214; insulating one of the contacts, step 216; providing a battery, step 218; and then attaching the battery to the substrate using a conductive adhesive, step 222.

Preferably for practicing the method of the invention the substrate has a substantially planar top surface. Additionally, preferably the battery includes a substantially planar positive contact surface and a substantially co-planar negative contact surface. Preferably, the battery would be similar to that depicted in FIGS. 1–3 and would be manufactured as set forth above. In order to provide the preferred receiving portion of the battery contact assembly, i.e., one similar to that shown in FIGS. 3 and 4, a positive and a negative contact must be established on the substrate. As was set forth above, the contacts can be formed as conductive traces that are screen printed onto the substrate or photolithographically etched onto the substrate. As was discussed above, an insulating patch is normally desirable to prevent inadvertent shorts between a contact surface on the battery and the opposite polarity contacts on the substrate. Accordingly, one of the contacts is insulated by applying an insulating patch of the type described above. This patch an be applied utilizing screen printing or other application methods known in the art. As was set forth above, to the extent the polarities are reversed, the insulating patch would then be placed over the positive contact. To the extent a trace configuration is utilized which varies from that set forth above, additional insulating patches may need to be installed as will be appreciated by those skilled in the art.

In addition to the above the battery must be adhered to the substrate. As is depicted, a conductive adhesive is initially applied to the substrate. Preferably, the adhesive is applied over the positive and negative contacts. Alternatively, the adhesive could be applied to the positive and negative contact surfaces of the battery without departing from the scope and spirit of the present invention. In the preferred method where the adhesive is applied on the positive and negative contacts, the battery is brought into contact with the adhesive such that the positive and negative contact surfaces of the battery contact the adhesive.

As was described above, an anisotropic adhesive like a z-axis adhesive normally requires pressure during curing in order to provide the necessary conducting characteristics. Accordingly, if required, pressure is applied in the direction of the desired conductivity during curing of the adhesive.

In the event a battery configuration is to be utilized as is shown in FIG. 5, without co-planar contact surfaces, the adhesive is slightly modified. In that configuration, a bead of conductive adhesive is applied to the positive contact trace, and a separate and distinct bead of conductive adhesive is applied to the negative contact trace.

With either embodiment, the battery is positioned such that the negative contact surface on the battery is immediately adjacent to the negative contact on the substrate, and the positive contact surface on the battery is immediately adjacent to the positive contact on the substrate.

Thus, the invention provides an improved battery and an improved battery contact assembly. Furthermore, although the method of the invention has been described with reference to certain preferred embodiments and preferred methods, as will be apparent to those skilled in the art, certain changes and modifications can be made without departing from the scope of the invention as defined by the following claims.

I claim:

1. A method for mounting a battery on a substrate comprising the steps of:

providing a substrate;

providing a battery for mounting on said substrate, said battery having a first contact surface and a second contact surface;

forming a first contact on said substrate;

forming a second contact on said substrate;

insulating said second contact from said first contact; and attaching said battery to said substrate using an electrically conductive adhesive to electrically connect said first contact surface to said first contact and said second contact surface to said second contact.

2. The method as claimed in claim 1 wherein said adhesive is selected from the group consisting of z-axis conductive adhesives and metal filled epoxy adhesives.

3. The method as claimed in claim 1 wherein said first and second contact surfaces on said battery are substantially co-planar to one another.

4. The method as claimed in claim 1 wherein said attaching step includes the sub-steps of:

applying said adhesive to said substrate over said first and second contacts.

5. The method as claimed in claim 1 wherein said first contact and second contact are formed on a same side of said substrate.

6. The method as claimed in claim 1 wherein said insulating step includes forming an insulating patch on a portion of either said first or second contact.

7. The method as claimed in claim 1 wherein said insulating step includes forming the substrate with an interlevel connector to either said first or second contact.

8. The method as claimed in claim 1 wherein said insulating step includes screen printing an insulating patch on a portion of either said first or second contact.

9. The method as claimed in claim 1 wherein said first contact and said second contact are formed by screen printing traces on said substrate.

10. The method as claimed in claim 1 wherein said first contact and said second contact are formed by depositing a conductive material on the substrate, photopatterning the material and then etching traces.

11. A method for mounting a battery on a substrate comprising the steps of:

providing a substrate;

providing a battery for mounting on said substrate, said battery having a positive contact surface and a negative contact surface, said positive contact surface and said negative contact surface being substantially co-planar;

forming a positive contact on a side of said substrate;

forming a negative contact on said side of said substrate;

insulating said negative contact from said positive contact; and forming a conductive adhesive between said substrate and said battery to attach said battery to said substrate and to electrically connect said positive contact surface to said positive contact and said negative contact surface to said negative contact.

12. The method as claimed in claim 11 wherein said forming a conductive adhesive step includes the sub-steps of:

applying said adhesive to said positive contact and said negative contact; and contacting said positive contact surface and said negative contact surface of said battery to said adhesive.

13. The method as claimed in claim 12 wherein said adhesive is selected from the group consisting of z-axis anisotropic adhesive and metal filled epoxy.

14. The method as claimed in claim 12 wherein said insulating step includes screen printing an insulating patch on a portion of either said negative contact or said positive contact.

15. The method as claimed in claim 12 wherein said positive contact and said negative contact are formed by a method selected from the group consisting of screen printing and photolithographic etching.

16. The method as claimed in claim 12 wherein said first and second contact surfaces are planar surfaces.

17. The method as claimed in claim 12 wherein said insulating step comprises forming an interlevel connector within said substrate in electrical communication with either said positive or negative contact.

* * * * *